United States Patent
Mateicka et al.

(10) Patent No.: US 9,013,065 B2
(45) Date of Patent: Apr. 21, 2015

(54) CONNECTING MECHANISM ARRANGEABLE TO A PHOTOVOLTAIC MODULE

(75) Inventors: Marian Mateicka, Behynce (SK); Jan Halaj, Piestany (SK); Stefan Starovecky, Piestany (SK); Pavel Kavicky, Piestany (SK); Christian Goebl, Nürnberg (DE)

(73) Assignee: Semikron GmbH & Co., KG, Nürnberg (DE)

( * ) Notice: Subject to any disclaimer, the term of this patent is extended or adjusted under 35 U.S.C. 154(b) by 820 days.

(21) Appl. No.: 13/168,790

(22) Filed: Jun. 24, 2011

(65) Prior Publication Data
US 2012/0025617 A1 Feb. 2, 2012

(30) Foreign Application Priority Data

Jun. 24, 2010 (DE) .......................... 10 2010 030 478

(51) Int. Cl.
| | |
|---|---|
| H02J 1/00 | (2006.01) |
| H02J 3/00 | (2006.01) |
| H01L 31/05 | (2014.01) |
| H01L 31/048 | (2014.01) |

(52) U.S. Cl.
CPC ............ H01L 31/05 (2013.01); H01L 31/0485 (2013.01); H01L 31/0486 (2013.01); Y02E 10/50 (2013.01)

(58) Field of Classification Search
USPC ..................................................... 307/77, 82
See application file for complete search history.

(56) References Cited

U.S. PATENT DOCUMENTS

| | | | |
|---|---|---|---|
| 7,796,391 B2 | 9/2010 | Fischer et al. | |
| 7,833,033 B2 | 11/2010 | McMahon et al. | |
| 8,197,263 B2 | 6/2012 | Rueggen et al. | |
| 2009/0206666 A1* | 8/2009 | Sella et al. | ...................... 307/43 |
| 2010/0018572 A1* | 1/2010 | Grimberg et al. | ............. 136/252 |
| 2010/0108376 A1 | 5/2010 | Richter et al. | |
| 2012/0033392 A1* | 2/2012 | Golubovic et al. | ........... 361/752 |
| 2012/0077392 A1* | 3/2012 | Thompson et al. | ........... 439/889 |

FOREIGN PATENT DOCUMENTS

| | | |
|---|---|---|
| DE | 10 2006 027 104 | 8/2007 |
| DE | 10 2007 020 846 | 10/2008 |
| DE | 10 2008 028 462 | 12/2009 |

OTHER PUBLICATIONS

EPO Search Report for EP Ser. No. 11 16 6658 (parallel patent application).

* cited by examiner

*Primary Examiner* — Carlos Amaya
(74) *Attorney, Agent, or Firm* — The Law Offices of Roger S. Thompson

(57) ABSTRACT

A connecting device which can be arranged relative to a photovoltaic module for the purpose of electrically connecting a plurality of photovoltaic modules to one another and/or to an inverter device comprising at least a housing. The housing includes a first housing element and a second housing element; first connection devices for electrical connection to the photovoltaic module arranged in the first housing element; and second connection devices for electrical connection to a further connecting device or to the inverter device of a semiconductor circuit having at least one semiconductor component arranged in the second housing element. The connecting device further includes first contact devices, which are associated with the first housing element, and second contact devices, which are associated with the second housing element. The semiconductor circuit arrangement can be electrically connected to the first connection devices.

9 Claims, 4 Drawing Sheets

CONNECTING MECHANISM ARRANGEABLE TO A PHOTOVOLTAIC MODULE

BACKGROUND OF THE INVENTION

1. Field of the Invention

The invention is directed to a connecting device, also known as a junction box.

2. Description of the Related Art

Connecting devices such as junction boxes are usually arranged directly on a photovoltaic module and are used for electrical connection to further photovoltaic modules and for electrical connection to an inverter device. Usually, the individual photovoltaic modules in a photovoltaic installation are connected in series and to the inverter device, for which purpose the connecting device also has a semiconductor circuit, usually comprising bypass diodes. This semiconductor device may also have a plurality of series-connected bypass diodes, depending on the internal circuitry of the photovoltaic module.

Such a semiconductor device therefore usually has the task of bypassing the associated photovoltaic module and of ensuring the flow of current in the overall photovoltaic installation should a fault occur.

By way of example, German Patent Application No. DE 10 2006 027 104 B3 discloses a connecting device which has a metal housing in comparison with others disclosed, for example, in German Patent Application No. DE 10 2007 020 846 A1. This metal housing improves the cooling of the semiconductor components inside the connecting device by virtue of these being arranged close to the edge at the lateral edges. Both embodiments of such connecting devices include first connection devices for connection to the photovoltaic module and second connection devices for connection within the photovoltaic installation. They likewise disclose semiconductor components primarily operating as bypass diodes, which are connected to the connection devices in accordance with the circuitry.

OBJECT AND SUMMARY OF THE INVENTION

It is an object of the invention to provide a connecting device for connecting to a photovoltaic module, wherein all of the relevant semiconductor components may be easily subjected to a function test without a photovoltaic module, are, at the same time, amenable to efficient cooling during operation and may be easily replaced in the event of a fault.

The starting point for the invention is a connecting device which can be arranged relative to a photovoltaic module for the purpose of electrically connecting a plurality of photovoltaic modules to one another and/or to an inverter device, as is customary in a series circuit of photovoltaic modules.

The inventive connecting device has a housing which comprises at least, or preferably precisely, two housing elements and has first and second connection devices. In this case, it is preferred if the first housing element is arranged directly on the photovoltaic module, typically on the back thereof, and is materially connected thereto. Emanating from the photovoltaic module are at least two, frequently more, DC connecting cables or connecting flat conductors which may be electrically conductively connected to first connection devices of the connecting device. In accordance with the prior art, these cables or flat conductors are bushed to provide necessary protection against moisture and with the necessary electrical insulation. In principle, suitable materials for use as the housing include plastic, and also metal or hybrid forms, for example with a first body element comprising plastic and a second body element comprising metal.

In this case, the first connection devices are arranged in the first housing element. It is preferred for the second connection devices also to be arranged in the first housing element so that they may serially connect the photovoltaic module via the connecting device within the photovoltaic installation. This produces a connecting unit for the complete external electrical connection of the connecting device.

The second housing element contains a semiconductor circuit arrangement as a functional unit which comprises all the semiconductor components, and also the complete interconnection setup therefor. This results in a semiconductor unit comprising the second housing portion and the semiconductor circuit arrangement, which as such is amenable to a complete electrical test.

This semiconductor circuit arrangement may advantageously be designed to have preferably only one preferably electrically insulating substrate and interconnects produced thereon. These interconnects have the semiconductor components of the semiconductor circuit arrangement arranged thereon as an unpackaged component and connected thereto as required by the circuitry. For the purpose of electrical insulation and to spread the heat from the heat loss which is produced, the semiconductor circuit arrangement is covered by a potting compound.

Alternatively, it may be advantageous to produce the semiconductor component as a packaged component and to arrange it in a force-fit fashion in respective push contact devices which are connected as required by the circuitry.

Further embodiments may also be preferred, particularly also suitable hybrid forms of the two explicitly mentioned embodiments. A common feature of all of these embodiments is electrical testability even without the arrangement of a first body element and without an associated photovoltaic module.

It is also preferred if the first body element has, as an integral part, a cooling device in thermal contact with the semiconductor circuit arrangement. It may likewise be advantageous to provide a recess in the first body element which extends through one cooling device from the inside of the housing, and wherein this recess is sufficiently sealed from environmental influences.

In the inventive device, the second body element also has second contact devices which electrically conductively connect the circuit arrangement to the connection devices of the first body element, which in turn have first contact devices for this purpose. These contact devices are advantageously in the form of plug or spring contacts. This reversible electrical connection and a suitable mechanical connection produce a connecting device in which the semiconductor components can be replaced in the event of a fault, such as during operation in a photovoltaic installation.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
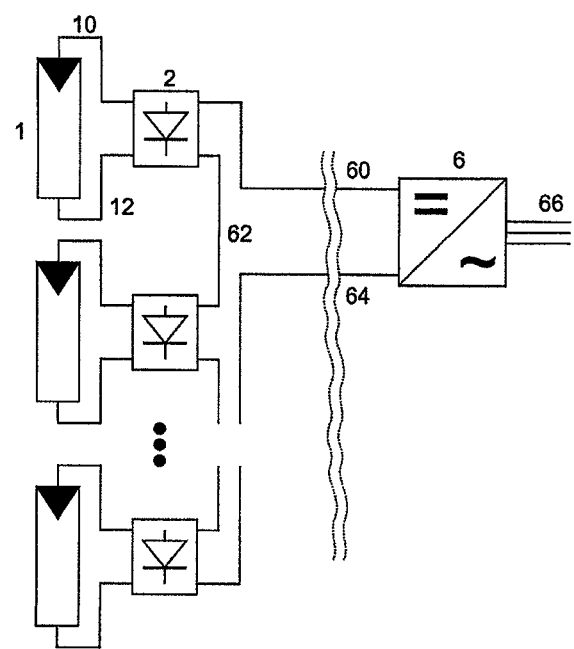
FIG. 1 schematically shows a photovoltaic installation with connecting devices according to the invention.

FIG. 1 schematically shows a photovoltaic installation having a plurality of photovoltaic modules 1 with a respective connecting device 2 according to the invention 1. It is preferred for connecting device 2 to be arranged directly on the back of photovoltaic module 1 and to be electrically conductively connected using the DC connecting cable or flat conductor 10, 12 respectively thereof.

Photovoltaic modules 1 are connected in series and to an inverter device 6 via respective connecting cables 60, 62, 64 by associated connecting devices 2. Inverter device 6 is used to convert the direct current produced in photovoltaic modules 1 into alternating current and to supply the alternating current to a power supply system 66. In this case, connecting device 2 is used not only for the electrical connection, but also for bypassing individual photovoltaic modules 1 in the event of a fault. A photovoltaic module 1 which is subject to a fault condition does not supply a current and has no conductivity. To protect the system upon the occurrence of a fault condition, connecting devices 2 have a semiconductor circuit arrangement (cf., FIG. 2, 50) which can act at least as a bypass.

Figure 2:
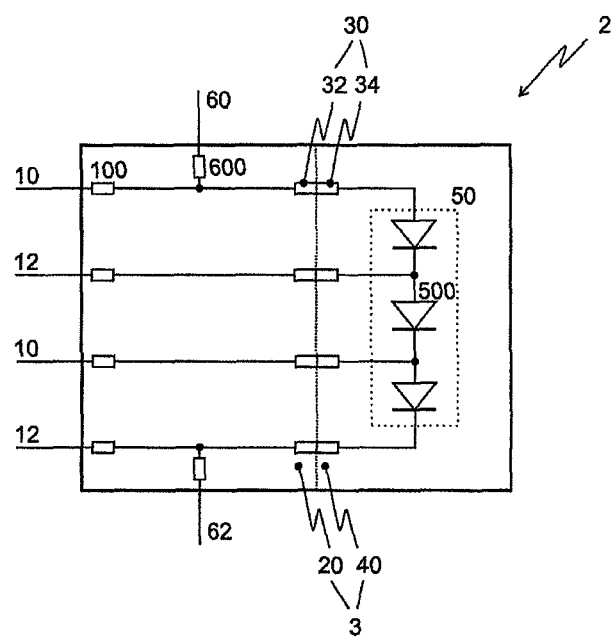
FIG. 2 shows a basic outline of a connecting device according to the invention.

FIG. 2 shows a basic outline of a connecting device 2 according to the invention. Connecting device 2 includes a housing 3 which comprises two housing elements 20, 40. As a result of the internal circuitry of a respective photovoltaic module 1, the latter frequently has more than the two necessary DC connecting cables or flat conductors 10, 12.

These—in the embodiment shown—four DC connecting cables or flat conductors 10, 12 are connected to first connection devices 100 in connecting device 2. These first connection devices 100, arranged in the first housing element, are also connected to first contact devices 32 likewise arranged in the first housing element 20 that are each designed so that contact can be made with them by associated second contact devices 34 in the second housing element 40.

Second housing element 40 contains a semiconductor circuit 50, which, in this case, comprises three diodes 500 which provide a bypass of photovoltaic module 1 (cf., FIG. 1). Second connection devices 600 for connection to further connecting devices 2 or to the inverter device 6 are likewise preferably arranged in the first housing element 20 in this case. In principle, however, it is also possible, if not preferred, for them to be arranged in second housing element 40.

Figure 3:
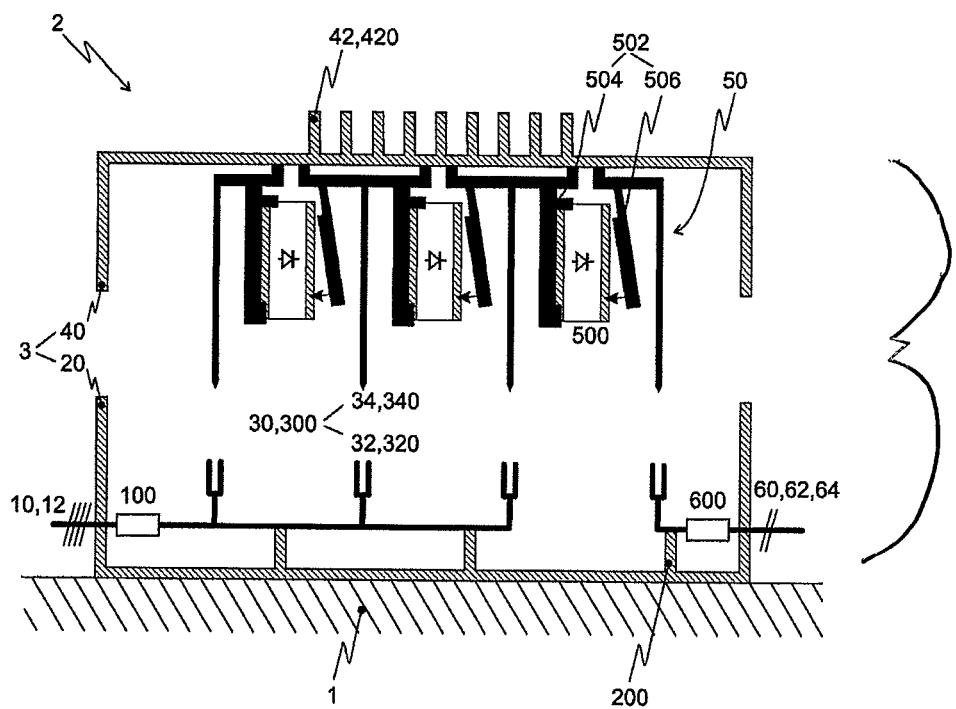
FIG. 3 shows a first embodiment of a connecting device according to the invention.

FIG. 3 shows a basic outline of a first embodiment of inventive connecting device 2 arranged directly on the back of a photovoltaic module 1. DC connecting cables 10, 12 are routed from photovoltaic module 1 into the connecting device 2. Necessary protection (not shown) for the insides of connecting device 2 against environmental influences are provided in this case. DC connecting cables 10, 12 are connected to first connection devices 100. Second connection devices 600, and associated cables 60, 62, 64 provide a serial connection within the photovoltaic installation. First and second connection devices 100, 600 are each arranged in first body element 20 of housing 3 of the connecting device 2 and therefore form the connecting unit therefor.

Second body element 40 of housing 3 of connecting device 2 includes semiconductor circuit 50, which produces the semiconductor unit. In this case, semiconductor circuit 50 comprises a plurality of push contact devices 502 which are connected directly, possibly with electrical insulation, to second housing element 40. These push contact devices 502 contain packaged semiconductor components 500, preferably power diodes, which are connected by force-fit connections. To this end, push contact devices 502 each have a holder 504 and a push element 506 with a resilient section.

Figure 3A:
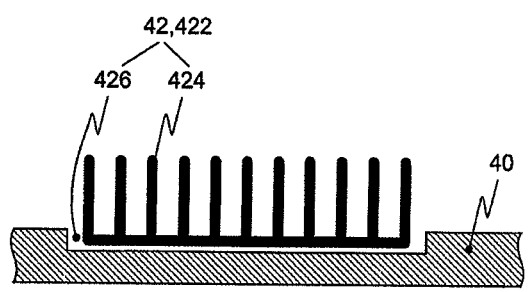

Advantageously, second housing element 40 is produced from an insulating, sufficiently thermally conductive plastic and has a plurality of cooling means 420 on its directly adjacent outside associated with the semiconductor circuit 50 or portions thereof. In the simplest embodiment, cooling means 420 are formed integrally with second body element 40 itself. Second housing element 40 can be produced from a metal material when thermal loading is higher. As an alternative, it may also be preferred for a section 426 of the outer wall of a plastic housing to be made thinner and for a metal heat sink 424 to be provided therein, as shown in FIG. 3a.

Referring again to FIG. 3, semiconductor circuit 50 is electrically connected to first and second connection devices 100, 600 via first contact devices 32 and associated second contact devices 34. In this case, respective first contact devices 32 are formed in first body element 20, while respective associated second contact devices 34 are formed in second body element 40. In this embodiment of connecting device 2, these respective contact devices 32, 34 are in the form of plug connectors 320, 340 and establish the respective contact between a first contact device 32 and its associated second contact device 34 when first body element 20 is arranged relative to second body element 40.

Hence, first body element 20 with its connection devices 100, 600 can be arranged on the back of photovoltaic module 1, and the entire photovoltaic installation can be completely electrically connected without the need for semiconductor circuit arrangement 50 itself to already be present. This likewise means that semiconductor circuit arrangement 50, as part of the semiconductor unit, can be subjected to electrical tests independently of the connecting unit. Similarly, this means that the semiconductor unit can easily be replaced in the event of a fault without having to disassemble, even partially, connections 60, 62, 64 of the photovoltaic installation.

Figure 4:
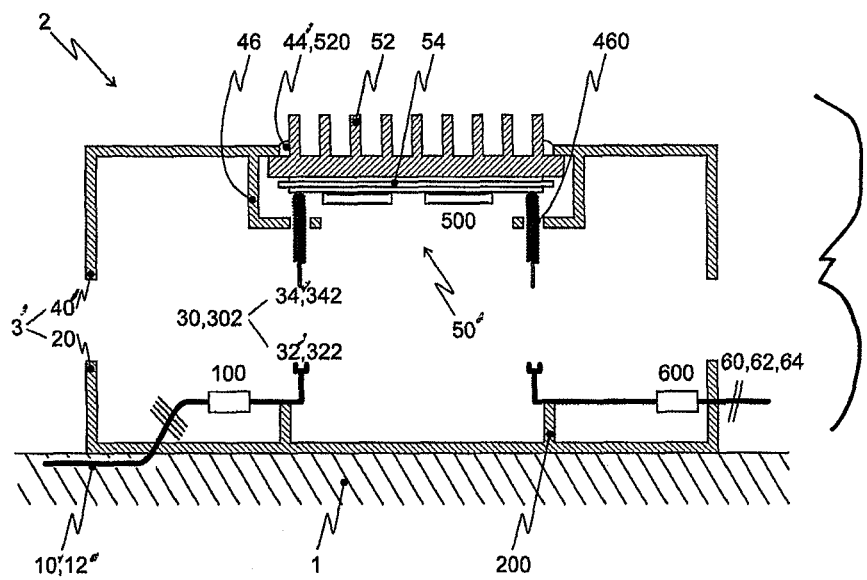
FIG. 4 shows a second embodiment of a connecting device according to the invention.

FIG. 4 shows a basic outline of a second embodiment of a connecting device 2 according to the invention. In this case, first body element 20 of housing 3 differs from that shown in FIG. 3 DC connecting cables 10, 12 and replaced by DC flat conductors 10', 12' provided as part of photovoltaic module 1 and these are routed into connecting device 2 on that side of the connecting device which faces photovoltaic module 1. Necessary protection (not shown) against environmental influences is likewise provided in this case.

In addition to second contact devices 34, which can be connected to first contact devices 32, holders 322 are provided to ensure reliable contact with a contact spring 342 as a second contact device.

Second housing element 40' of housing 3 and also the semiconductor circuit 50 provided therein in this embodiment differ significantly from those shown in FIG. 3. In this case, second housing element 40' has an opening 44 which is provided for the purpose of arranging a cooling device 52 therein in the form of a heat sink which is associated with semiconductor circuit 50 and to seal cooling device 52 against environmental influences by a sealing device 520. In this case, it is preferred and, on the basis of the thermal loading, usually sufficient, if cooling device 52 is a passive cooling device in the form of an aluminum heat sink. For special applications, however, an active cooling device, for example equipped with an additional fan, may also be preferred.

Heat sink 52 holds semiconductor circuit 50, facing the inside of housing 3. This semiconductor circuit comprises a substrate 54 which is electrically insulated from heat sink 52 but which has very good thermal conductivity. What are known as DCB (direct copper bonded) substrates are particularly advantageous for this purpose, but IMS substrates or simple printed circuit boards are also suitable, depending upon the demands of the application as to thermal conductivity.

In principle, substrate 54 has a plurality of interconnects 542 with preferably unpackaged semiconductor components 500 which are connected to one another in accordance with the circuitry, for example by wire bonds or by a flexible conductor structure in accordance with the circuitry. When unpackaged semiconductor components 500 are used, it is also particularly preferred for these to be covered by a mass of insulating material, such as silicone rubber, which is not shown.

In this refinement, second contact devices 34 provided are contact springs 342, which are preferably mounted in second housing element 40' by means of retaining devices 46, 460 which are designed integrally or in multiple parts of the second housing element.

When the first housing element 20' is arranged relative to the second housing element 40', the contact springs 342 are put under pressure and produce a reliable, but also completely reversible electrical connection with first contact elements 32 via holders 322 in first housing element 20. First housing element 20' contains necessary abutments 200 for producing a counterpressure for this spring contact-connection 302.

In principle, it is likewise possible for the functions of the first and second contact devices 32', 34' to be interchanged, that is to say for the first contact device provided to be a contact spring and for the second contact device provided to be an associated holder.

Similarly, it may be advantageous to replace or combine features of the embodiment of one of the two connecting devices with features of the respective other one. This relates particularly to the embodiment of the cooling device and to the embodiment of the first and second contact devices.

Figure 5:
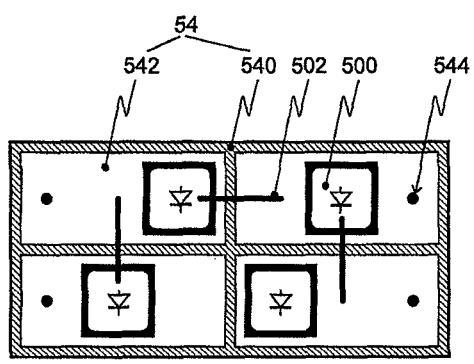
FIG. 5 shows a semiconductor circuit arrangement for a connecting device according to the invention.

FIG. 5 shows a semiconductor circuit 50 for a connecting device 3 according to the invention. FIG. 5 shows a substrate 54 with an insulating material base body 540 and interconnects 542 arranged thereon, each interconnect having a semiconductor component 500, in this case a power diode, and a contact area 544 for the contact spring (cf., FIG. 4, 342) arranged on it in materially connected fashion. The figure also schematically shows connection 502 of the power diodes (500) in accordance with the circuitry, connection 502 being able to be produced very easily in this case by a composite film comprising an insulating material film and a metal foil, which in this case is intrinsically patterned, for example. This connection in accordance with the circuitry can likewise be made by means of bonding wires.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A connecting device which can be arranged relative to a photovoltaic module for electrically connecting a plurality of photovoltaic modules to at least one of another photovoltaic module and an inverter device, the connecting device comprising:
a housing having a first housing element configured to be disposed directly on the photovoltaic module and a second housing element having a cutout therein;
first connection devices for electrical connection to at least one of the plurality of photovoltaic modules disposed within said first housing element;
second connection devices for electrical connection to one of a further connecting device disposed within a further connection device and to an inverter device of a semiconductor circuit having at least one semiconductor component arranged in said second housing element;
first contact devices, which are associated with said first housing element;
second contact devices, which are associated with said second housing element, whereby the semiconductor circuit is configured to be electrically connected to said first connection devices; and
a cooling device;
whereby said semiconductor circuit is a functional unit including at least one electrically insulating substrate with interconnects arranged thereon and with said semiconductor components materially connected thereto; and
whereby said cooling device is in thermal contact with at least one of said at least one electrically insulating substrate and is arranged in said cutout.

2. The connecting device of claim 1, wherein said second connection devices are arranged in said second housing element.

3. The connecting device of claim 1, wherein the semiconductor circuit includes at least one electrically insulating substrate with interconnects arranged thereon and with semiconductor components materially connected thereto.

4. The connecting device of claim 3, wherein said first and second contact devices are in the form of a plug contact device.

5. The connecting device of claim 3, wherein said first and second contact devices are in the form of a spring contact device to which pressure is applied when said first housing element is arranged relative to said second housing element.

6. The connecting device of claim 1, wherein the semiconductor circuit includes a plurality of push contact devices having a respective packaged semiconductor component for making force-fit contact therewith.

7. The connecting device of claim 1, wherein said first and second contact devices connect the semiconductor circuit to said second connection devices.

8. The connecting device of claim 1, wherein said first and second contact devices are in the form of a plug contact device.

9. The connecting device of claim 1, wherein said first and second contact devices are in the form of a spring contact device to which pressure is applied when said first housing element is arranged relative to said second housing element.

* * * * *